(12) United States Patent
O'Neill

(10) Patent No.: US 6,583,736 B1
(45) Date of Patent: Jun. 24, 2003

(54) BITCODE SEQUENCE CODING OF FREQUENTLY OCCURRING VALUES

(75) Inventor: Thomas G. O'Neill, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 5 days.

(21) Appl. No.: 10/025,618

(22) Filed: Dec. 26, 2001

(51) Int. Cl.[7] .............................................. H03M 7/46
(52) U.S. Cl. ............................ 341/63; 341/50; 341/107
(58) Field of Search ........................... 341/107, 63, 50

(56) References Cited

U.S. PATENT DOCUMENTS 5,086,439 A * 2/1992 Asai et al. .................. 375/241
5,844,508 A * 12/1998 Murashita et al. ............ 341/51

* cited by examiner

Primary Examiner—Peguy JeanPierre
(74) Attorney, Agent, or Firm—Gunnison, McKay & Hodgson, L.L.P.; Philip J. McKay

(57) ABSTRACT

A method for significantly decreasing the number of times prior art coding schemes, such as variable length coding, are implemented in the course of encoding/decoding a given data block includes cataloging the occurrences, or locations, of a designated frequently occurring value in the data block and then excluding the frequently occurring value from the prior art coding scheme.

27 Claims, 6 Drawing Sheets

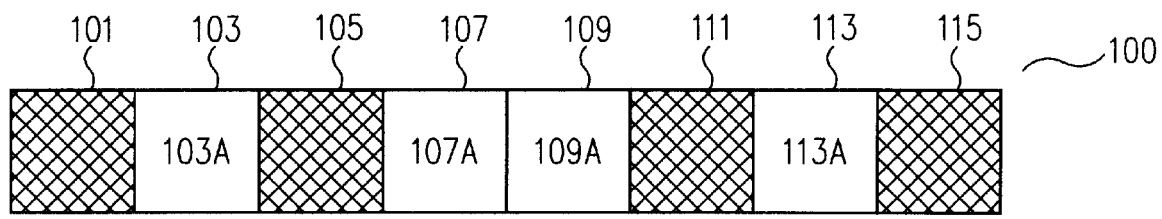
FIG. 1A
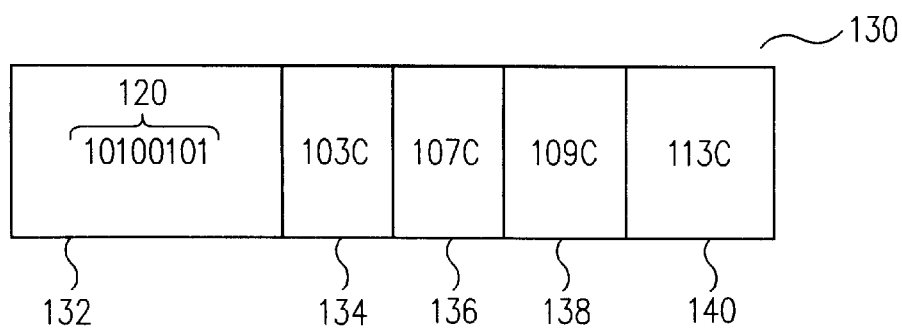
FIG. 1B
FIG. 1C

BITCODE SEQUENCE CODING OF FREQUENTLY OCCURRING VALUES

COPYRIGHT NOTICE

Portions of this document contain material that is subject to copyright protection. The copyright owner has no objection to the facsimile reproduction of the patent document or the patent application, as it appears in the Patent and Trademark Office file or records, but otherwise reserves all rights whatsoever.

1. Field of the Invention

The present invention relates primarily to the field of data compression, and in particular, to a method for coding at least one designated frequently occurring value.

2. Background of the Invention

Computer systems are increasingly being required to call up, process, and display data, especially multimedia (audio and video) data. However, many computer systems are unable to transfer data quickly and efficiently. This is particularly true for video data. Consequently, the transfer of video data from a multimedia file in storage can be slow, inefficient, unreliable and often inadequate for acceptably immediate and continuous playback.

One reason the transfer of video data is particularly problematic is that video data processing is very memory intensive; i.e., video data requires large amounts of memory for storage and use by a computer system.

Since delay in the transfer of data is directly proportional to the amount of data to be transferred, another solution to the problem of transmitting a large amount of data is to compress the data for transmission and decompress it back at the destination. Some examples of prior art compression schemes are Motion JPEG, MPEG-4 and QuickTime. Many of these prior art coding schemes employ variable length coding.

Variable length coding is a method of compressing data that produces a unique bit sequence, or code, for each entity of text, audio, video, or graphics data in a file. Variable length encoding methods achieve compression by mapping the data (or data sequences) to codes whose average length is less than that of the original representation of the data. Consequently, there is a significant savings of memory space used to store the data.

Using variable length coding, the length of a code is typically based on the probability of the occurrence of the particular data represented by the code, with higher probability data typically having shorter length codes and lower probability data typically having longer length codes. This embodiment of variable length coding is sometimes called entropy coding.

Some prior art coding schemes are not variable but are instead "fixed length" schemes. To show the advantages and operation of variable length coding, as opposed to fixed length coding, assume, as a simplified example, that 10,000 characters in a file are a combination of only five unique characters, "a", "b", "c", "d" and "e". Further assume that the five unique characters occur with the following frequency: "a" occurs most frequently at 4100 times; "b" occurs 2600 times; "c" occurs 1700 times; "d" occurs 1200 times and "e" occurs least frequently at 400 times.

An exemplary fixed length coding scheme for the example above is shown in Code Mapping Table 1. An exemplary variable length coding scheme, in this example a Huffman coding scheme, could be implemented as also shown in Code Mapping Table 1.

| Code Mapping Table 1 | | | | | |
|---|---|---|---|---|---|
| | a | b | c | d | e |
| Frequency | 4100 | 2600 | 1700 | 1200 | 400 |
| Fixed Length | 000 | 001 | 010 | 011 | 100 |
| Variable-length | 1 | 01 | 000 | 0010 | 0011 |

As seen in Code Mapping Table 1, a typical fixed length coding scheme assigns each character a unique fixed bit code, in this example a fixed, three bit code. Consequently, the 10,000 characters of the present example would require 30,000 bits to encode using the fixed length coding scheme of the Code Mapping Table 1.

As also seen in Code Mapping Table 1, a typical variable length coding scheme assigns each of the five unique characters a unique variable length code with frequently occurring characters, such as "a", assigned short codes and infrequently occurring characters, such as "e", assigned longer codes. In particular, "a" has been encoded with a single bit since it is the most frequently occurring character (4,100 occurrences). As discussed in more detail below, the most frequently occurring character is often referred to herein as the Most Probable Value (MPV). The next most frequently occurring characters, "b" and "c", are represented by two bits and three bits, respectively, and "d" and "e" are represented by four bits since they are the least frequently occurring characters.

Using variable length coding, the decoding process involves receiving only a first bit and then checking this first bit with each code entry in Code Mapping Table 1 to see if the first bit comprises an allowed code. If the first bit does comprise an allowed code, the mapping is completed and the decoding process is over. However, if the first bit does not comprise an allowed code, a second bit is received, and the two bits in combination are checked with each code entry in Code Mapping Table 1 to determine if the combination of bits comprises an allowed code. This process is repeated for each new bit, with the combination of each new bit and all previously received bits being checked, with each code entry in Code Mapping Table 1 to determine if the combination of bits comprises an allowed code, until an allowed code is detected.

In the example above, using prior art variable length coding, 20,800 bits (4100 * 1+2600 * 2+1700 * 3+1200 * 4+400 * 4) were used to encode the entire file. Recall that using fixed length coding 30,000 bits were used. Consequently, despite its cumbersome nature, prior art variable length coding provides a significant savings of approximately 31.7% over fixed length coding. This is a significant improvement to say the least. However, there are several significant drawbacks to prior art variable length encoding schemes.

One significant drawback of variable length coding schemes is the cumbersome and time consuming nature of the decoding process. As discussed with respect to the example provided above, decoding involves receiving new bits one at a time and then, with each new bit received, checking the ensemble of received bits with each code entry of the code mapping table until a unique allowed code is received. Consequently, even for our simplified example, including only five unique characters, the variable length decoding process is long and cumbersome.

To make matters worse, in real systems the number of possible unique characters is typically much larger than our assumed five from above. Consequently, the code mapping table used, such as Code Mapping Table 1 discussed above, can become prohibitively large as the number of unique characters increases. Further, the average length of the codewords is also larger. As explained above, since each bit has to be checked with all the code entries in the code mapping table until a unique allowed code is received, this can become a significant problem. Once again, this is clearly a time consuming, inefficient and cumbersome process.

Other types of variable length coding schemes use variable-bit codes that start with a unary-encoded number (i.e. a sequence of zeroes where the value encoded is the number of zeroes). Golomb, Golomb-Rice, and adaptive prefix coding are all examples of variable-bit codes that start with a unary-encoded number. As discussed in more detail below, for certain implementations that employ a temporary buffer to assist in the extraction of bit sequences from a whole-byte data read in from the input device, the decoder can count the zeroes with less work than actually extracting each zero bit one at a time. For these variable bit codes, the number of zeroes can be used to deduce exactly how many bits you should read to get the next codeword. This provides a somewhat more efficient process than the Huffman type variable length decoding process described above, however, the process is still cumbersome and inefficient.

The problems discussed above with respect to prior art coding schemes were particularly pronounced since, using prior art schemes, each and every character was typically subjected to the coding and decoding process. As a result, many prior art coding schemes employing variable length coding were not well suited to environments where there was little processing power available, e.g., thin clients. Since a current emphasis in the electronics industry is on portable devices and thin clients, the inability of prior art coding schemes to operate efficiently in this environment was a significant handicap.

What is needed is a method of decreasing the number of times the prior art coding schemes are invoked so that time and processing energy are conserved while, at the same time, the benefits of prior art coding schemes, such as variable length coding, are still incurred.

SUMMARY OF THE INVENTION

The present invention provides a method for significantly decreasing the number of times prior art coding schemes, such as variable length coding, are implemented in the course of encoding/decoding a given data block. One embodiment of the invention involves a method of coding frequently occurring values, such as the Most Probable Value (MPV), that includes cataloging all the occurrences, or locations, of the MPV in a data segment, or block, of the data stream. According to one embodiment of the invention, the locations containing the MPV, i.e., the MPV locations, are denoted with a first bitcode value, such as "1" and the locations containing values other than the MPV, i.e., the non-MPV locations, are denoted with a second bitcode value, such as "0". According to one embodiment of the invention, the bitcodes for the MPV and non-MPV locations are then combined into a bitcode sequence and the bitcode sequence is included in an encoded block of data, herein also referred to as an E-data block, which is created according to the method of the invention.

In another embodiment of the invention, methods of identifying and denoting the MPV locations other than row bitcode sequences can be utilized with the invention including, but not limited to, run-length encoding or various other encoding methods known in the art.

According to one embodiment of the invention, the values in the non-MPV locations are then encoded by any one of several prior art coding schemes well known in the field such as Huffman coding. According to one embodiment of the invention, these coded non-MPV values are then included in the E-data block as well.

According to the invention, the decoding process is simply the reverse of the coding process. When decoding, the bitcode sequence is used to determine the locations of the MPV and the MPV value is inserted at the specified locations, without invoking any of the decoding routines of the prior art coding schemes. Then, according to one embodiment of the invention, the prior art coding scheme is used to decode the encoded non-MPV values and these non-MPV values are inserted in the non-MPV locations. Consequently, according to the invention, the cumbersome prior art decoding processes are only used on the non-MPV values.

Recall that, as discussed above, prior art coding schemes, such as variable length coding, are cumbersome and time consuming processes and that the problems associated with prior art coding schemes, such as variable length coding, were particularly pronounced because, using prior art methods, each and every value was typically subjected to the coding and decoding process.

In contrast, using the method of the invention, the MPV, or any designated frequently occurring value, is left out of the prior art coding process. Consequently, according to the invention, fewer values need to be encoded and decoded using prior art coding schemes and therefore these cumbersome processes and routines are used less frequently. The variable length decoding process including receiving new bits, one at a time, then, with each new bit received, checking the ensemble of received bits with each code entry of the code mapping table until an allowed code is received, is not invoked for the most frequently occurring values. Therefore, the cumbersome variable length decoding process is frequently avoided and the processing of the data is significantly sped up and simplified.

Further, the MPV can be excluded from -representation in the prior art coding scheme, resulting in shorter code words for the non-MPV values. Thus, the bit by bit decoding process is shortened even for non-MPV values.

In one embodiment of the invention, the MPV locations are specified before sending the variable length codes for the non-MPVs. This is done to maximize decoding efficiency. In this one embodiment of the invention, the non-MPVs are only then encoded and the MPV locations are excluded from the encoding process.

In one embodiment of the invention, bits representing the locations of the MPVS, i.e., the bits in the bitcode sequence, are written or read in a single group of bits, during encoding or decoding of the data, instead of in a sequence of separate writes or reads. In contrast, in the prior art, a separate variable bit read or write was required for each occurrence of the MPV. This was typically very costly since reads from, and writes to, physical devices must be made in multiples of 8 bits. Consequently, to perform I/O of a non-integer number of bytes, additional processing is required.

For instance, consider the input case. First, an integral number M of bytes is typically read into a temporary buffer. The desired bits must be extracted using bit shift (>>) and bitwise AND operations (&). When all of the bits in the temporary buffer have been used, a new set of M bytes is read into the temporary buffer. For fixed-width I/O (including the 1-bit at a time used when reading in Huffman codes), one knows before-hand when the buffer will be exhausted. However, for variable-width reads such as used in some implementations of adaptive prefix coding, Colomb coding and Colomb-Rice coding, the decoder must check after every read whether the buffer is empty or not. The output case is similar: one uses bit shift (<<) and OR (|) operations to combine the bit sequences into an integral number of M bytes, then writes the M bytes to the output. Again variable-width writes require checking to see if the buffer is full after every variable-bit sequence is added.

Since, according to one embodiment of the invention, the bits in the bitcode sequence are written or read in a single group of bits, during encoding or decoding of the data, the method of the invention avoids the costly process described above. Therefore, the method of the invention significantly reduces the overhead involved in invoking the encoder or decoder routine and the bit I/O.

One embodiment of the invention works particularly well with the prior art technique of creating and sending a row bit mask to represent any rows of data, in a matrix of data, where every location in the row holds the MPV. In this case, according to the invention, the row bit mask for the entire matrix is also included in the resulting E-data block. In this embodiment of the invention, the bit code sequences and non-MPV codes are sent for only those rows with one or more non-MPV values. This further reduces the overhead involved in invoking the encoder or decoder routines of the prior art coding schemes.

The present invention can be used in conjunction with any prior art coding schemes, including but not limited to: Huffman coding, Golomb coding and variable length coding using adaptive prefix codes. When the present invention is employed with one of these prior art coding schemes, or with any other coding scheme, the present invention provides an encoding and decoding process that is extremely easy to perform and is used efficiently and effectively by any computing system. The present invention is also particularly advantageous when used by a thin client system that does not have high processing power or extensive memory.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings:

FIG. 1A is an illustration of a typical portion of a data stream, referred to herein as a data block;

FIG. 1B is an illustration of an exemplary bitcode sequence, associated with the data block of FIG. 1A, as would be created in accordance with the principles of one embodiment of the invention;

FIG. 1C is an illustration of the E-data block, associated with the data block of FIG. 1A, as would be created in accordance with the principles of one embodiment of the invention;

DETAILED DESCRIPTION

Figure 2A:
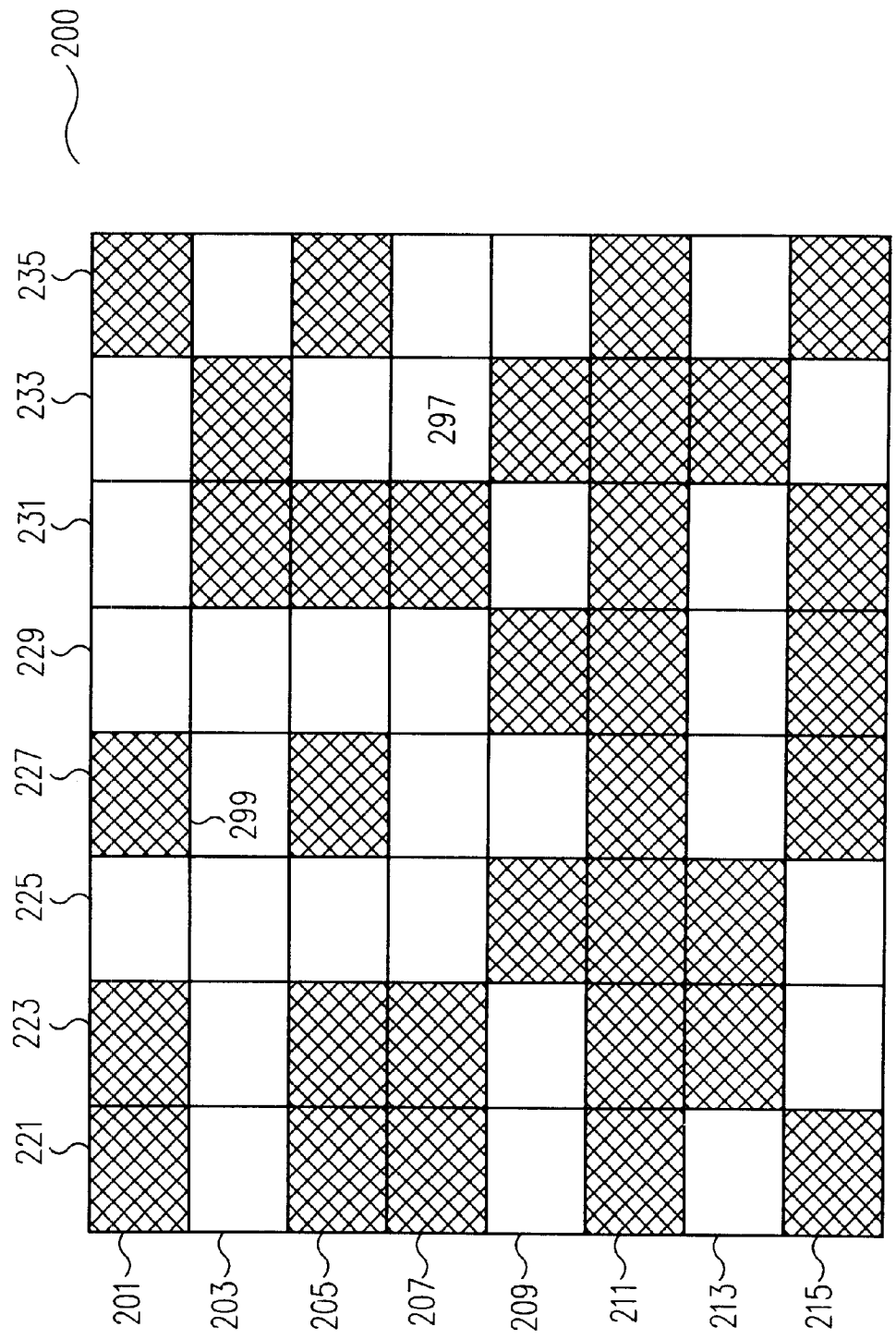
FIG. 2A is an illustration of an 8×8 matrix of data.

The invention will now be described in reference to the accompanying drawings. The same reference numbers may be used throughout the drawings and the following description to refer to the same or like elements or parts.

In the following description, numerous specific details are set forth to provide a more thorough description of embodiments of the invention. However, it will be apparent to one skilled in the art that the invention may be practiced without these specific details. In other instances, well known features have not been described in detail so as not to obscure the invention in common knowledge.

The present invention provides a method (300 in FIG. 3 and 500 in FIG. 5) for coding frequently occurring values, such as the Most Probable Value (MPV), that includes cataloging all the occurrences, or locations (101, 105, 111, and 115 in FIG. 1A and 299 in FIGS. 2A, 2B and 4), of the MPV in a data segment, or block, (100 in FIG. 1A and 200 in FIGS. 2A, 2B and 4) of the data stream. According to one embodiment of the invention, the locations containing the MPV, i.e., the MPV locations, are denoted with a first bitcode value, such as "1", and the locations containing values other than the MPV, i.e., the non-MPV locations, are denoted with a second bitcode value, such as "0". According to one embodiment of the invention, the bitcodes for the MPV and non-MPV locations are then combined into a bitcode sequence (120 in FIG. 1B and FIG. 1C) and the bitcode sequence is inserted into an encoded block of data (130 in FIG. 1C), herein also referred to as E-data block 130, that is created according to the method of the invention.

In another embodiment of the invention, methods of identifying and denoting the MPV locations, other than row bitcode sequences, can be utilized with the invention including, but not limited to, run-length encoding or various other encoding methods known in the art.

Furthermore, various combinations of such techniques could be used to catalog the MPV locations. If non-MPV values are rare enough, it could even be efficient to provide a list of their positions, perhaps encoded with a variable-bit code (e.g., "the tenth, 73rd, and 154th values are not equal to the MPV).

Run-length coding is described on pp. 145–146 of W. B. Pennebaker and J. L. Mitchell, "JPEG: Still Image Data Compression Standard," Chapman & Hall, New York (1993), that is incorporated herein, in its entirety, by reference for all purposes. Run length encoding is a standard technique for representing frequently occurring values. For example, the MPV specification could be a compact representation of a description along the lines of:

"There are 5 non-MPV values, followed by 8 MPV values, followed by . . . "

One example method for representing such a description would be a fixed-width N-bit number giving the repeat count M followed by a single bitcode identifying whether the next M values were MPV or non-MPV. In this case, the presence of the bitcode allows runs of more than $2^N$ values to be represented as more than one contiguous runs of length $2^N$.

Another method for representing such a description is with a variable-bit code for the repeat count M. In this case, runs of any length can be represented. Thus, a single bitcode can be used to identify whether the first run is MPV or non-MPV, and the remaining runs can be assumed to alternate between MPV and non-MPV.

Another example method of run-length coding would be useful when the invention is used to catalog the locations of $2^n-1$ frequently occurring values. In this case bitcodes of length n are used, with $2^n-1$ of the possible bitcodes representing a single occurrence of one of the frequent values and the remaining bitcode value used to tag the occurrence of a run of frequent or infrequent values. When said remaining bitcode value occurs, additional information in the data stream would be used to specify the length and nature of the run. The nature of the run could either be a contiguous sequence consisting entirely of one of the frequent values or a contiguous sequence consisting entirely of any of the infrequent values in any order.

One of ordinary skill in the art will further recognize that there are many possible ways to practice the invention, and that the selection of the method to use depends greatly on the distribution and nature of the data being encoded.

According to one embodiment of the invention, the non-MPV values (103A, 107A, 109A and 113A in FIG. 1A) in the non-MPV locations (103, 107, 109 and 113 in FIG. 1A and 297 in FIGS. 2A, 2B and 4) are then encoded by any one of several prior art coding schemes well known in the field such as Huffman coding. According to one embodiment of the invention, these coded non-MPV values (103C, 107C, 109C and 113C in FIG. 1C) are then included in the E-data block as well.

According to the invention, the decoding process is basically the reverse of the encoding process. When decoding, the bitcode sequence is used to determine the locations of the MPV and this MPV value is inserted at these locations, without invoking any of the decoding routines of the prior art coding schemes. Then the prior art coding scheme is used to decode the non-MPV values and these values are inserted in the non-MPV locations. Consequently, according to the invention, the cumbersome prior art decoding processes are only used on the non-MPVs.

Thus, according to one embodiment of the called separately and the variable bit reads and writes are not performed separately for every instance of the MPV. Consequently, a significant amount of time is saved. This is in sharp contrast to prior art variable length coding schemes where each character, including each occurrence of the MPV, had to be checked against all the entries in the code mapping table.

The present invention can be used with any prior art encoding schemes. Some of these prior art encoding schemes include, but are not limited to, Huffman coding, Golomb coding and variable length coding using adaptive prefix codes. A complete description of the variable length encoding scheme using adaptive prefix codes is contained in co-pending U.S. patent application entitled "Entropy Coding Using Adaptive Prefix Codes", Ser. No. 09/779,333 of inventor Russell Brown filed on Feb. 8, 2001 and assigned to the assignee of the present invention that is incorporated herein by reference, in its entirety, for all purposes.

When the present invention is employed with any of these prior art coding schemes, or any other coding scheme, the present invention provides a process that is extremely easy to perform and is used efficiently and effectively by any computing system. The present invention is particularly advantageous when used by a thin client system that does not have high processing power or extensive memory.

FIG. 1A shows a typical portion 100 of a data stream, referred to herein as data block 100. As seen in FIG. 1A, data block 100 includes positions, or locations 101, 103, 105, 107, 109, 111, 113 and 115. Each of locations 101, 103, 105, 107, 109, 111, 113 and 115 hold a value, or a character, for potential encoding. In FIG. 1A, the shaded locations, such as locations 101, 105, 111 and 115 hold the same, frequently occurring, value. In one embodiment of the invention, this same, frequently occurring, value is the most frequently occurring value; also called the Most Probable Value (MPV). The non-shaded locations 103, 107, 109 and 113 in data block 100 hold other various non-MPV values. Hereinafter, locations holding the MPV or designated frequently occurring value, such as locations 101, 105, 111 and 115 in FIG. 1A, will be referred to as MPV locations and locations holding non-MPVs, such as locations 103, 107, 109 and 113 will be referred to as non-MPV locations.

According to one embodiment of the invention, all MPV locations 101, 105, 111 and 115 in data block 100 are exhaustively cataloged and then denoted with a first bitcode value. According to one embodiment of the invention, all non-MPV locations 103, 107, 109 and 113 in data block 100 are denoted with a second bitcode value. In one embodiment of the invention the bitcode value for MPV locations 101, 105, 111 and 115 is a digital "1" and the bitcode value for non-MPV locations 103, 107, 109 and 113 is a digital "0". In another embodiment of the invention, the bitcode value for MPV locations 101, 105, 111 and 115 is a digital "0" and the bitcode value for non-MPV locations 103, 107, 109 and 113 is a digital "1". Those of skill in the art will also readily recognize that, in other embodiments of the invention, other codes can be used to differentiate the MPV locations 101, 105, 111 and 115 from non-MPV locations 103, 107, 109 and 113.

As shown in FIG. 1B, according to one embodiment of the invention, the bitcode values for the MPV locations 101, 105, 111 and 115 and non-MPV locations 103, 107, 109 and 113 are combined into a bitcode sequence 120 representing the sequencing and locations of MPV and non-MPV values in data block 100. In FIG. 1B, bitcode sequence 120 is created by assigning a digital "1" to each MPV location 101, 105, 111 and 115 and a digital "0" to each non-MPV location 103, 107, 109 and 113. As seen in FIG. 1B, since the first, third, sixth and eighth locations 101, 105, 111 and 115, respectively, of data block 100 are MPV locations, the first, third, sixth and eighth positions of bitcode sequence 120 are "1". Likewise, since the second, fourth, fifth and seventh locations 103, 107, 109 and 113, respectively, of data block 100 are non-MPV locations, the second, fourth, fifth and seventh positions of bitcode sequence 120 are "0".

According to one embodiment of the invention, bitcode sequence 120 is then included in an encoded data block 130, hereinafter called E-data block 130 (FIG. 1C), which is created according to the method of the invention. In one embodiment of the invention, bitcode sequence 120 is created and sent, and MPV locations 101, 105, 111 and 115 are specified, at the beginning of E-data block 130, in first position 132. In one embodiment of the invention, this is done to maximize decoding efficiency. However, those of skill in the art will recognize that bitcode sequence 120 can be included in any position within E-data block 130, so long as the position is either chosen consistently or identified. Consequently, the specific embodiment of the invention shown in FIG. 1C, including bitcode sequence 120 in position 132, is chosen for illustrative purposes only.

In one embodiment of the invention, the non-MPV values 103A, 107A, 109A and 113A of data block 100 (FIG. 1A) are encoded using prior art encoding schemes, such as variable length coding, to become the encoded non-MPV values 103C, 107C, 109C and 113C shown in FIG. 1C. As discussed above, the non-MPV values 103A, 107A, 109A and 113A can be encoded with any prior art encoding schemes, including but not limited to: Huffman coding, Golomb coding and variable length coding using adaptive prefix codes. According to one embodiment of the invention, encoded non-MPV values 103C, 107C, 109C and 113C are then included in E-data block 130 in positions 134, 136, 138 and 140, respectively.

According to the invention, the decoding process is, for the most part, the reverse of the coding process. When decoding, bitcode sequence 120 is used to determine the sequence of MPV locations 101, 105, 111 and 115 and the MPV is inserted at MPV locations 101, 105, 111 and 115, without invoking any of the decoding routines of the prior art coding schemes. Then, according to one embodiment of the invention, the prior art coding scheme is used to decode the encoded non-MPV values 103C, 107C, 109C and 113C and the decoded non-MPV values 103A, 107A, 109A and 113A are inserted in non-MPV locations 103, 107, 109 and 113. Consequently, according to the invention, the cumbersome prior art decoding processes and routines are only invoked for the non-MPV values.

Recall the example discussed above where 10,000 characters in a file are a combination of only five unique characters, "a", "b", "c", "d" and "e" and the five unique characters occur with the following frequency: "a" occurs 4100 times; "b" occurs 2600 times; "c" occurs 1700 times; "d" occurs 1200 times and "e" occurs 400 times. Applying one embodiment of the present invention to this example, a 10,000 bit bitcode sequence could be used to specify the locations of the character "a", i.e., the MPV for this example. However, a more convenient embodiment of the invention might involve sending 313 bitcode sequences, of 32 bits each, which would each be followed by the non-"a", i.e., non-MPV, values such as "b", "c", "d" or "e", from the next 32 values in the file. In this case, according to the invention, only the four non-MPV values "b", "c", "d" or "e" need to be represented in the coding scheme.

An exemplary fixed length coding scheme for this example is shown in Code Mapping Table 2. An exemplary variable length coding scheme, in this example a Huffman coding scheme, could be implemented as also shown in Code Mapping Table 2.

| Code Mapping Table 2 | | | | |
|---|---|---|---|---|
| | b | c | d | e |
| Frequency | 2600 | 1700 | 1200 | 400 |
| Fixed Length | 00 | 01 | 10 | 11 |
| Variable-length | 1 | 00 | 010 | 011 |

As seen in Code Mapping Table 2, for this particular example, the variable length codes are a full bit shorter than those shown in Code Mapping Table 1 that were created using prior art methods. Since, according to the invention, 10,000 bits of bitcode sequence are added, the application of one embodiment of the invention to this particular example has no impact on bandwidth. However, the 10,000 single bit reads required in the prior art are replaced, according to the invention, with 313 reads of 32 bits. Clearly, this is a marked improvement in efficiency. Part of the improvement associated with the present invention comes from the not performing single bit reads for the MPV, as was done in the prior art, and part of the improvement comes from performing a smaller number of single bit reads for the non-MPV values, which, thanks to the invention, now have shorter variable length codes.

Further, the invention has reduced the space used by the fixed-length code from 30,000 bits to 21,800 bits (10,000+2 * 5900). Thus, the invention has brought the fixed length code much closer to the compression of the variable-length coding scheme discussed above.

Those of skill in the art will recognize that, for fixed-length codes, the invention is most useful when the resulting fixed length codes are at least one bit smaller. This is because if the method of the invention doesn't shorten the fixed-length code, then using the invention can increase both the CPU usage and the bandwidth usage of the fixed-length code. Consequently, when used with fixed length codes, the invention is most useful when the number of characters is $2^n+m$ where m is a small number.

In the variable length code case, according to one embodiment of the invention, a second bitcode sequence of 5900 bits may be used to represent the positions of "b", following the first bit mask. In this case, only 3300 remaining values will be Huffman-coded as shown in Code mapping table 3:

| Code Mapping Table 3 | | | |
|---|---|---|---|
| | c | d | e |
| Frequency | 1700 | 1200 | 400 |
| Variable-length | 0 | 10 | 11 |

In this embodiment of the invention, it takes 20,800 bits to represent the data (10,000+5900+1700 +2 *1200+2 * 400). Once again, the bandwidth is unaffected since the code lengths are reduced by a full bit. However, with this embodiment of the invention, we have replaced 15900 of the single-bit reads with 498 reads (313+185) of 32 bits each.

The invention is particularly useful in cases where the MPV or frequently occurring characters identified in the bitcode sequence(s) are significantly more common than the remaining non-MPV characters. As shown in the example of Code Mapping Table 3, when the frequency of the characters falls off relatively quickly, it is useful to employ successive bitcode sequences of one bit per character: a first sequence for the MPV, a second shorter sequence for the second-most common character, etc. In contrast, in cases where the $2^n$ most frequent characters have approximately equal frequency, it is more efficient to use a bitcode of n bits per character to construct a single bitcode sequence. One of ordinary skill in the art will recognize that the optimum representation of the locations of the MPV or other frequently occurring characters will in general depend on the specific distribution of the data to be encoded.

As shown above, when utilizing the method of the present invention, in some embodiments, because of encoder and decoder memory constraints and/or to make optimal use of encoder and decoder cache, it is useful to limit the size of the E-blocks. In the example of the 10,000 character file containing the five unique characters "a" to "e", discussed above, one embodiment of the invention provides the data as 313 E-blocks each containing a 32-bit MPV-locating row bitcode sequence followed by the non-MPV entropy codes.

As discussed above, using the method of the invention, the MPV, or any designated frequently occurring value, is left out of the prior art coding process. Consequently, according to the invention, fewer values need to be encoded and decoded using prior art coding schemes. Therefore, this cumbersome variable length decoding process is frequently avoided and the processing of the data is significantly sped up and simplified.

In addition, when, as in one embodiment of the invention, variable length coding is the coding scheme used with the invention, the variable length codes for the non-MPV values are shorter than they would be using prior art methods that included the MPV as a valid code word.

As discussed above, in one embodiment of the invention, MPV locations 101, 105, 111 and 115 are specified before sending encoded non-MPV values 103C, 107C, 109C and 113C to E-data block 130. As also discussed above, this is done to maximize decoding efficiency.

In the example of one embodiment of the invention discussed above with respect to FIGS. 1A, 1B and 1C, it was generally assumed that the value in MPV locations 101, 105, 111 and 115 was the MPV. However, those of skill in the art will recognize that the value in locations 101, 105, 111 and 115 could also be any frequently occurring value and need not be limited to the MPV. In addition, in other embodiments of the invention, the inventive method can be applied multiple times to the same data with different designated values (for example, the first and second most probable values), in different locations, being cataloged and denoted and then exempted from the prior art coding schemes with each run. Consequently, the values chosen to be cataloged and denoted, and the number of times the method of the invention is applied to the same data, will vary from application to application, according to the needs of the system and the designer. Therefore, the present invention is not intended to be limited to the particular embodiments of the invention discussed herein and numerous variations of the invention will be readily apparent to those skilled in the art in light of this disclosure.

In many applications, the occurrence frequency of the MPV is very pronounced when compared with the frequency of the occurrence of the non-MPVs, i.e., the data is highly concentrated at the Most Probable Value with significantly fewer occurrences of non-Most Probable Vales than the Most Probable Value. One such application is video data where the Most Probable Value is typically zero and is by far the most frequently occurring value. In applications such as video, where the occurrence frequency of the MPV is very pronounced, variable length coding is very useful for encoding and storage. However, the shortcomings of decoding using variable length coding are also particularly evident and problematic in video processing and display. Consequently, in these applications, the method of the invention is particularly advantageously employed.

In the following discussion, the invention is described in connection with storing and processing video data. One feature of certain video data storage schemes is the fact that the Most Probable Value (MPV), such as the unique character "a" in the example of Code Mapping Table 1 above, is typically zero. This assumption is useful in describing embodiments of the invention and is therefore made in the discussion below. However, as shown above, the present invention is equally applicable to the storing of non-video data and can be advantageously used to enhance performance of any one of a wide variety of non-video and video data processing and storage schemes.

Video data is typically transferred in 8×8 matrices, with each of the resulting 64 positions, or locations, in the matrix storing information about the pixels in the matrix. FIG. 2A shows a typical 8×8 data matrix 200 including 64 positions, or locations, such as exemplary locations 297 and 299, for storing video data. As shown in FIG. 2A, the 64 locations of data matrix 200 are arranged in eight rows 201, 203, 205, 207, 209, 211, 213 and 215 and eight columns 221, 223, 225, 227, 229, 231, 233 and 235.

In FIG. 2A, the shaded squares, such as exemplary location 299, represent locations where the MPV occurs, also called MPV locations. As mentioned above, in the following discussion the MPV for video data is assumed to be zero. In contrast, the non-shaded squares, such as exemplary location 297, represent locations where non-MPV values occur, also called non-MPV locations.

As with the example discussed above with respect to FIGS. 1A, 1B and 1C, according to one embodiment of the present invention, all MPV locations in data matrix 200 of FIG. 2A are denoted, or identified, by assigning a first bitcode value to MPV locations, such as, in one embodiment, setting a single bit equal to a "1", and all non-MPV locations are denoted by assigning a second bitcode value to non-MPV locations, such as, in one embodiment, by setting a single bit equal to a "0". In this way, a bitcode sequence is constructed that specifies the location of MPVs.

Figure 2B:
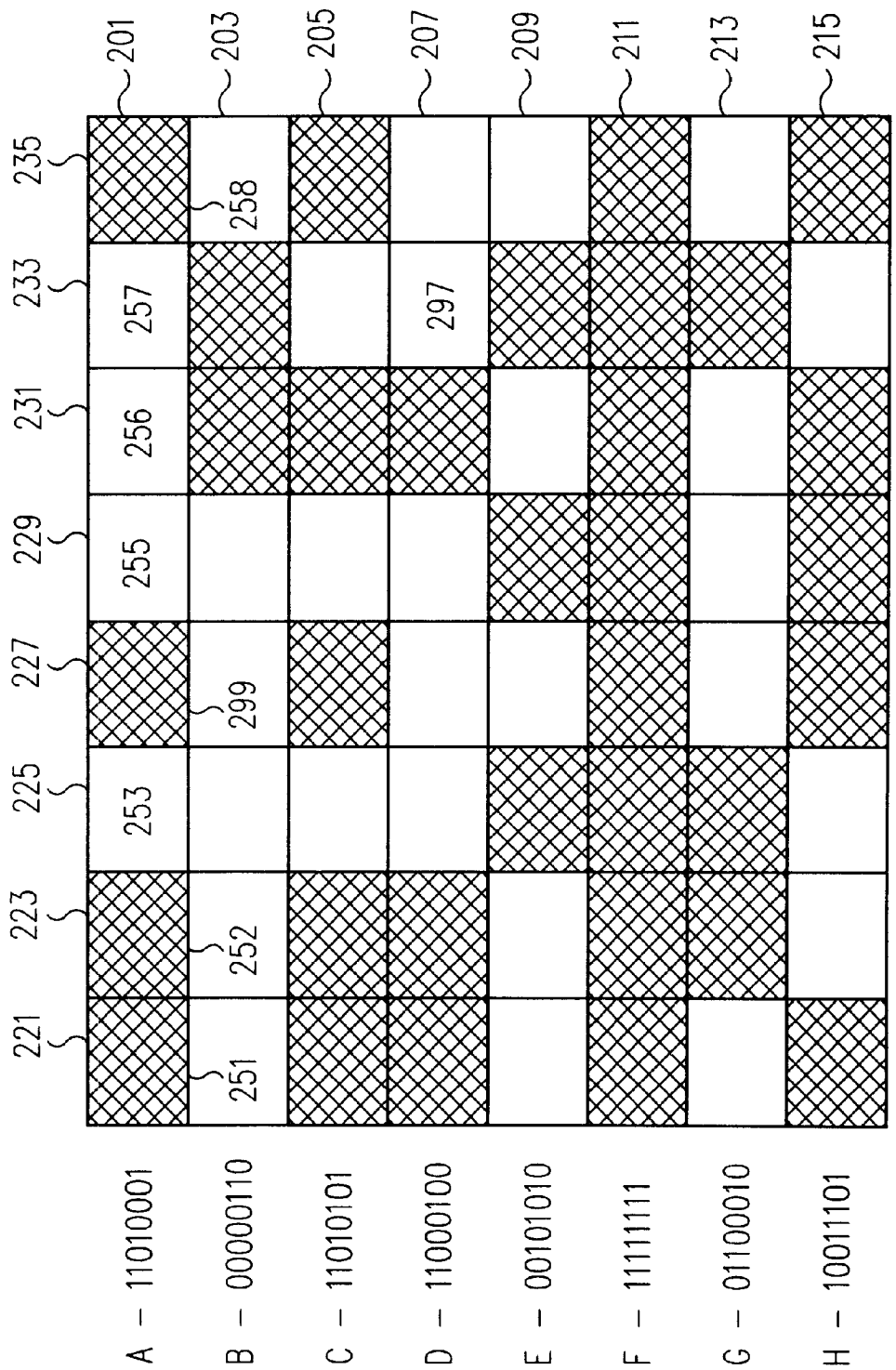
FIG. 2B is an illustration of coding the MPV and non-MPV locations of an 8×8 matrix in accordance with the principles of one embodiment of the invention.

FIG. 2B shows an illustration of the same data matrix 200 shown in FIG. 2A with the row bitcode sequences A, B, C, D, E, F, G, and H for rows 201, 203, 205, 207, 209, 211, 213, and 215, respectively, shown to the left of rows 201, 203, 205, 207, 209, 211, 213, and 215, respectively.

In one embodiment of the invention, each of the row bitcode sequences A, B, C, D, E, F, G, and H is created in the same manner as bitcode sequence 120 discussed above with respect to FIGS. 1A and 1B. Indeed, in one embodiment of the invention, the entire data matrix 200 of video data is simply treated as a series of eight rows 201, 203, 205, 207, 209, 211, 213, and 215 where each row 201, 203, 205, 207, 209, 211, 213, and 215 is processed exactly as set forth in the discussion above regarding FIGS. 1A and 1B and then the results of the row bitcodes are combined into a matrix bitcode and included in a large E-data block (not shown) similar to E-data block 130 in FIG. 1C. According to this embodiment of the invention, the remaining values in the non-MPV locations, such as exemplary non-MPV location 297, are then encoded using any of the prior art coding schemes discussed above and the encoded non-MPV values are also included in the E-data block.

A general sequence of operations for encoding data according to one embodiment of the invention includes:

a) Create row bitcode sequence for the first row;

In FIG. 2B, for row 201, the first row, the bitcode sequence A is 11010001 with values of "1" at the first, second, fourth, and eighth positions of bitcode sequence A representing MPV locations 251, 252, 299 and 258, respectively, and values of "0" at the third, fifth, sixth and seventh positions representing non-MPV locations 253, 255, 256 and 257, respectively.

b) Create row bitcode sequence for the second row;

Repeat process for second row 203 to obtain row bitcode sequence B (00000110 in FIG. 2B).

c) Create row bitcode sequence for the third row;

Repeat process for row 205 to obtain row bitcode sequence C (11010101 in FIG. 2B).

d) Create row bitcode sequence for the fourth row;
Repeat process for row 207 to obtain row bitcode sequence D (11000100 in FIG. 2B).

e) Create row bitcode sequence for the fifth row;
Repeat process for row 209 to obtain row bitcode sequence E (00101010 in FIG. 2B).

f) Create row bitcode sequence for the sixth row;
Repeat process for row 211 to obtain row bitcode sequence F (11111111 in FIG. 2B);

g) Create row bitcode sequence for the seventh row;
Repeat process for row 213 to obtain row bitcode sequence G (01100010 in FIG. 2B).

h) Create row bitcode sequence for the eighth row;
Repeat process for row 215 to obtain row bitcode sequence H (10011101 in FIG. 2B).

i) Create row bitcode sequence for any remaining rows;

j) Combine a) to i) to obtain a matrix bitcode sequence;
For data matrix 200 in FIGS. 2B and 4:
1101000100000110110101011100010000101010111111110110001010011101 k) Include matrix bitcode sequence in E-data block;

l) Encode non-MPV values using prior art coding scheme;

m) Include encoded non-MPV values in E-data block.

Figure 3:
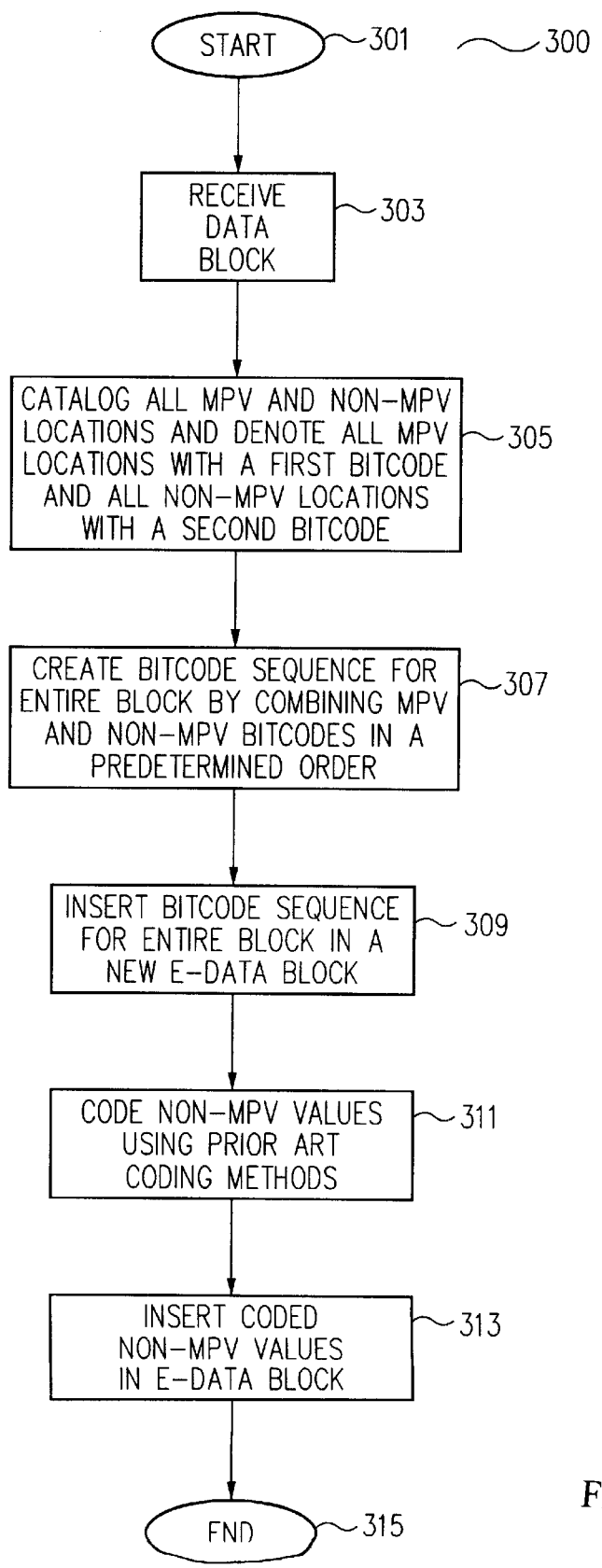
FIG. 3 is a flowchart depicting the sequence of events to specify the MPV and non-MPV locations in accordance with the principles of one embodiment of the invention.

FIG. 3 is a flowchart graphically illustrating one process 300 according to the principles of the present invention. Process 300 starts at 301.

At 303, the raw data block is received for encoding. As discussed above, in one embodiment of the invention, the raw data is video data and is packaged in 8×8 matrices, such as data matrix 200 in FIGS. 2A and 2B, for transfer or storage.

At 305 in FIG. 3, the locations of the MPVs are cataloged and denoted with a first bitcode value, such as single bit equal to a "1", and all non-MPVs locations are denoted with a second bitcode value, such as a single bit equal to a "0", in the manner discussed above.

At 307, a bitcode sequence for the entire data block is created which represents the MPV and non-MPV locations in the data block.

At 309, the bitcode sequence is sent to an E-data block that is created in accordance with the method of the invention.

At 311, the non-MPV values in the non-MPV locations of the data block are coded using any one of numerous coding schemes to create encoded non-MPVs;

At 313, the encoded non-MPVs are sent to the E-data block; the encoding process ends at 315.

According to this embodiment of the invention, as with the embodiment discussed above with respect to FIGS. 1A, 1B and 1C, the decoding process is, more or less, simply the reverse of the coding process. When decoding, the matrix bitcode sequence is used to determine the sequence of MPV locations, such as exemplary MPV location 299 (FIG. 2A), and the MPV is inserted at the MPV locations, without invoking any of the decoding routines of the prior art coding schemes. Then, according to one embodiment of the invention, the prior art coding scheme is used to decode the encoded non-MPV values and these decoded non-MPV values are inserted in non-MPV locations, such as exemplary non-MPV location 297. Consequently, according to the invention, the cumbersome prior art decoding processes and routines are only used on the non-MPVs.

As was discussed above, when, as in one embodiment of the invention, the process of FIG. 3 is used with variable length coding, the variable length codes for the non-MPV values are shorter than codes created using prior art methods that required the MPV be included as a valid code word. In addition, the cumbersome variable length decoding process is not invoked for the most frequently occurring values. Therefore, this variable length decoding process is frequently avoided and the processing of the data is significantly sped up and simplified.

As also discussed above, in one embodiment of the invention, the MPV locations are specified before sending encoded non-MPV values to the E-data block. This is done, in one embodiment of the invention, to maximize decoding efficiency. In this embodiment of the invention, the non-MPV values are then encoded using a prior art encoding scheme and the MPV locations are excluded from the prior art encoding and decoding process.

In the one embodiment of the invention discussed above with respect to FIGS. 2A, 2b and 3, the method of the invention was described as being applied on a row by row basis and the bitcode sequences created were row bitcode sequences. However, those of skill in the art will readily recognize that the method of the invention can also be applied on a column basis and column bitcode sequences could be created for columns 221, 223, 225, 227, 229, 231, 233 and 235. In this embodiment of the invention, the inventive process described above would be essentially the same and would be equally effective. Consequently, the one embodiment of the invention described above with respect to FIGS. 2A, 2B and 3 was chosen for illustrative purposes only and is not intended to limit the invention to the one embodiment discussed.

In addition, in the example of one embodiment of the invention discussed above with respect to FIGS. 2A, 2b and 3, a row bitcode sequence was used to identify and denote the MPV locations. However, in another embodiment of the invention, methods of identifying and denoting the MPV locations, other than row bitcode sequences, can be utilized with the invention including, but not limited to, run-length encoding or various other encoding methods known in the art.

Furthermore, various combinations of such techniques could be used to catalog the MPV locations. If non-MPV values are rare enough, it could even be efficient to provide a list of their positions, perhaps encoded with a variable-bit code (e.g., "the tenth, 73rd, and 154th values are not equal to the MPV).

Run-length coding is described on pp. 145–146 of W. B. Pennebaker and J. L. Mitchell, "JPEG: Still Image Data Compression Standard," Chapman & Hall, New York (1993), that is incorporated herein, in its entirety, by reference for all purposes. Run-length coding is a standard technique for representing frequently-occurring values. For example, the MPV specification could be a compact representation of a description along the lines of:

"There are 5 non-MPV values, followed by 8 MPV values, followed by . . ."

One example method for representing such a description would be a fixed-width N-bit number giving the repeat count M followed by a single bitcode identifying whether the next M values were MPV or non-MPV. In this case, the presence of the bitcode allows runs of more than 2^N values to be represented as more than one contiguous runs of length 2^N.

Another method for representing such a description is with a variable-bit code for the repeat count M. In this case, runs of any length can be represented. Thus, a single bitcode can be used to identify whether the first run is MPV or non-MPV, and the remaining runs can be assumed to alternate between MPV and non-MPV.

Another example method of run-length coding would be useful when the invention is used to catalog the locations of $2^n-1$ frequently occurring values. In this case bitcodes of length n are used, with $2^n-1$ of the possible bitcodes representing a single occurrence of one of the frequent values and the remaining bitcode value used to tag the occurrence of a run of frequent or infrequent values. When said remaining bitcode value occurs, additional information in the data stream would be used to specify the length of the run and which value is repeated.

One of ordinary skill in the art will further recognize that there are many possible ways to practice the invention, and that the selection of the method to use depends greatly on the distribution and nature of the data being encoded. Consequently, the one embodiment of the invention described above with respect to FIGS. 2A, 2B and 3 was chosen for illustrative purposes only and is not intended to limit the invention to the one embodiment discussed.

In addition, in the example of one embodiment of the invention discussed above with respect to FIGS. 2A, 2b and 3, it was generally assumed that the value in MPV locations was the MPV. However, those of skill in the art will recognize that the value in the shaded MPV locations could also be any frequently occurring value and need not be limited to the MPV. In addition, in other embodiments of the invention, the inventive method can be applied multiple times to the same data with different values (for example the first and second most frequently occurring values), in different locations, being cataloged and denoted and then all of these different values exempted from the prior art coding schemes: Consequently, the values chosen to be cataloged and denoted, and the number of times the method of the invention is applied to the same data, will vary from application to application, according to the needs of the system and the designer. Therefore, the present invention is not intended to be limited to the particular embodiments of the invention discussed herein and numerous variations of the invention will be readily apparent to those skilled in the art in light of this disclosure.

Figure 4:
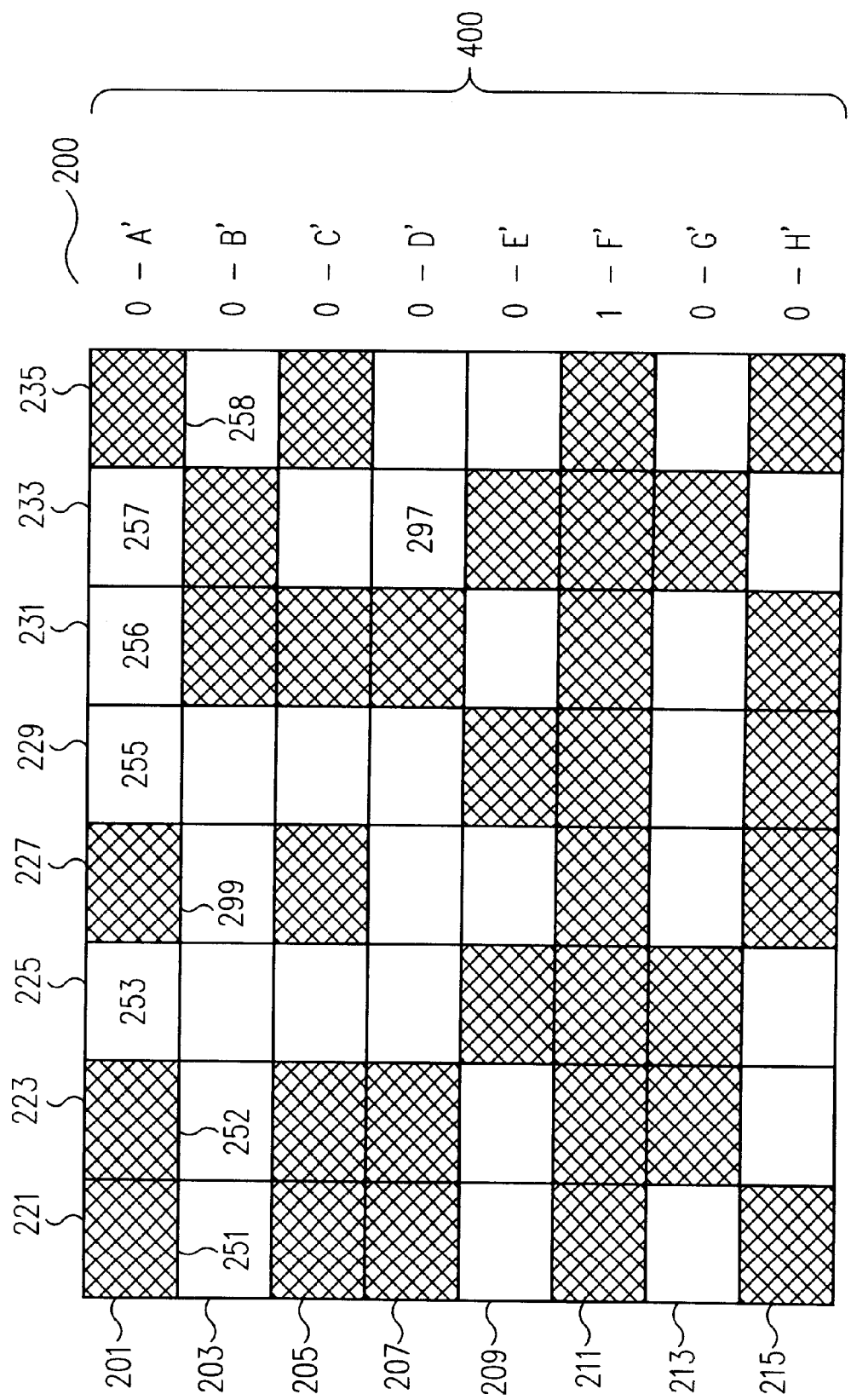
FIG. 4 is an illustration of a row-coding bit mask for the 8×8 matrix of FIGS. 2A and 2B in accordance with the principles of one embodiment of the invention.

As shown in FIGS. 2A, 2B and 4, there can be some rows of data in a data matrix, such as row 211 in data matrix 200, that have the MPV in all locations. Other rows, such as rows 201, 203, 205, 207, 209, 213, and 215 may comprise all or some non-MPV locations. Consequently, it may useful to employ the prior art technique of using a row bit mask to specify which rows, such as row 211, comprise all MPV locations. Row bit masks, and their operation, are discussed in: commonly assigned U.S. patent application Ser. No. 09/560,440 of inventors Subramania Sudharsanan and Parthasarathy Sriram, entitled "Block-Based, Adaptive Lossless Image Coder"; and in the article by the same inventors entitled "Block-Based, Adaptive Lossless Image Coder" pp. 120 to 124 of "The Proceedings of the International Conference on Image Processing", Vancouver, Canada, September 2000, both of which are incorporated herein, in their entirety, by reference for all purposes.

FIG. 4 shows data matrix 200 of FIGS. 2A and 2B and uses data matrix 200 to illustrate the construction of a row bit mask 400. Row bit mask 400 of FIG. 4 includes row bitcodes A', B', C', D', E', F', G', and H' for rows 201, 203, 205, 207, 209, 211, 213, and 215, respectively.

According to one embodiment of the invention, row bit mask 400 is created by assigning a first row bitcode value, such as "1", to all rows having only MPVs in every row location. In one embodiment of the invention, a second row bitcode value, such as "0", is assigned to all rows that include at least one non-MPV location. Consequently, according to one embodiment of the invention, since row 201 has non-MPV locations, row 201's row bitcode value, A', is "0". Likewise, rows 203, 205, 207, 209, 213, and 215 also have row bitcode values B', C', D', E', G' and H', respectively, of "0". In contrast, row 211 has the MPV in all its locations and hence has a row bitcode, F', of "1".

According to one embodiment of the invention, each of the row bitcodes A', B', C', D', E', F', G', and H' for the individual rows 201, 203, 205, 207, 209, 211, 213 and 215 are combined to create row bit mask 400.

In one embodiment of the invention, for the convenience of decoding, row bit mask 400 is sent to the E-data block (not shown) before any other row information such as the row bitcode sequence, or the encoded non-MPV values. In this embodiment of the invention, the bit mask is sent first since it is clearly advantageous not to send any additional information, such as the row bitcode F of FIG. 2B, for those rows, such as row 211, which are entirely comprised of MPV locations.

A general sequence of operations for encoding video data according to one embodiment of the invention includes:

a) Create a row bit mask;

In FIG. 4, since row 211, the sixth row, has MPV values in all its locations, and all other rows 201, 203, 205, 207, 209, 213 and 215 have non-MPV locations, the row bit mask 400 for data matrix 200 is 00000100, with the only "1" value, representing row 211, in the sixth position.

b) Include row bit mask in E-data block;

c) Create row bitcode sequence for the first row if it is not entirely composed of MPV locations;

In FIG. 4, for row 201, the first row, the bitcode sequence A is 11010001 with values of "1" at the first, second, fourth, and eighth positions of bitcode sequence A representing MPV locations 251, 252, 299 and 258, respectively, and values of "a" at the third, fifth, sixth and seventh positions representing non-MPV locations 253, 255, 256 and 257, respectively.

d) Create row bitcode sequence for the second row if it is not entirely composed of MPV locations;

Repeat process for second row 203 to obtain row bitcode sequence B (00000110 in FIG. 2B).

e) Create row bitcode sequence for the third row if it is not entirely composed of MPV locations;

Repeat process for row 205 to obtain row bitcode sequence C (11010101 in FIG. 2B).

f) Create row bitcode sequence for the fourth row if it is not entirely composed of MPV locations;

Repeat process for row 207 to obtain row bitcode sequence D (11000100 in FIG. 2B).

g) Create row bitcode sequence for the fifth row if it is not entirely composed of MPV locations;

Repeat process for row 209 to obtain row bitcode sequence E (00101010 in FIG. 2B).

h) Create row bitcode sequence for the sixth row if it is not entirely composed of MPV locations;

Row 211 is entirely composed of MPV locations so no further processing of row 211 is needed.

i) Create row bitcode sequence for the seventh row if it is not entirely composed of MPV locations;

Repeat process for row 213 to obtain row bitcode sequence G (01100010 in FIG. 2B).

j) Create row bitcode sequence for the eighth row if it is not entirely composed of MPV locations;

Repeat process for row 215 to obtain row bitcode sequence H (10011101 in FIG. 2B).

k) Create row bitcode sequence for any remaining rows that are not entirely composed of MPV locations;

l) Combine a) to i) to obtain a matrix bitcode sequence;

For data matrix 200 in FIGS. 2B and 4, with row bit mask 400 at the beginning of the sequence:
000001001101000100000110110101011100010000101 0100110001010011101.

m) Include matrix bitcode sequence in E-data block;

n) Encode non-MPV values using prior art coding scheme;

o) Include encoded non-MPV values in E-data block.

In this case, according to the invention, row bit mask 400 for the entire data matrix 200 is also included in the resulting E-data block (not shown) and row bitcode sequences and non-MPV codes for only those rows with one or more non-MPV locations are created and included in the E-data block. For the example above, for instance, there was a row bitcode sequence created for row 209 at "g)" and a row code sequence created for row 213 at "i)". However, no row code sequence was created for all MPV row 211 at "h)". This further reduces the overhead involved in invoking the encoder or decoder routines of the prior art coding schemes such as variable length coding.

Figure 5:
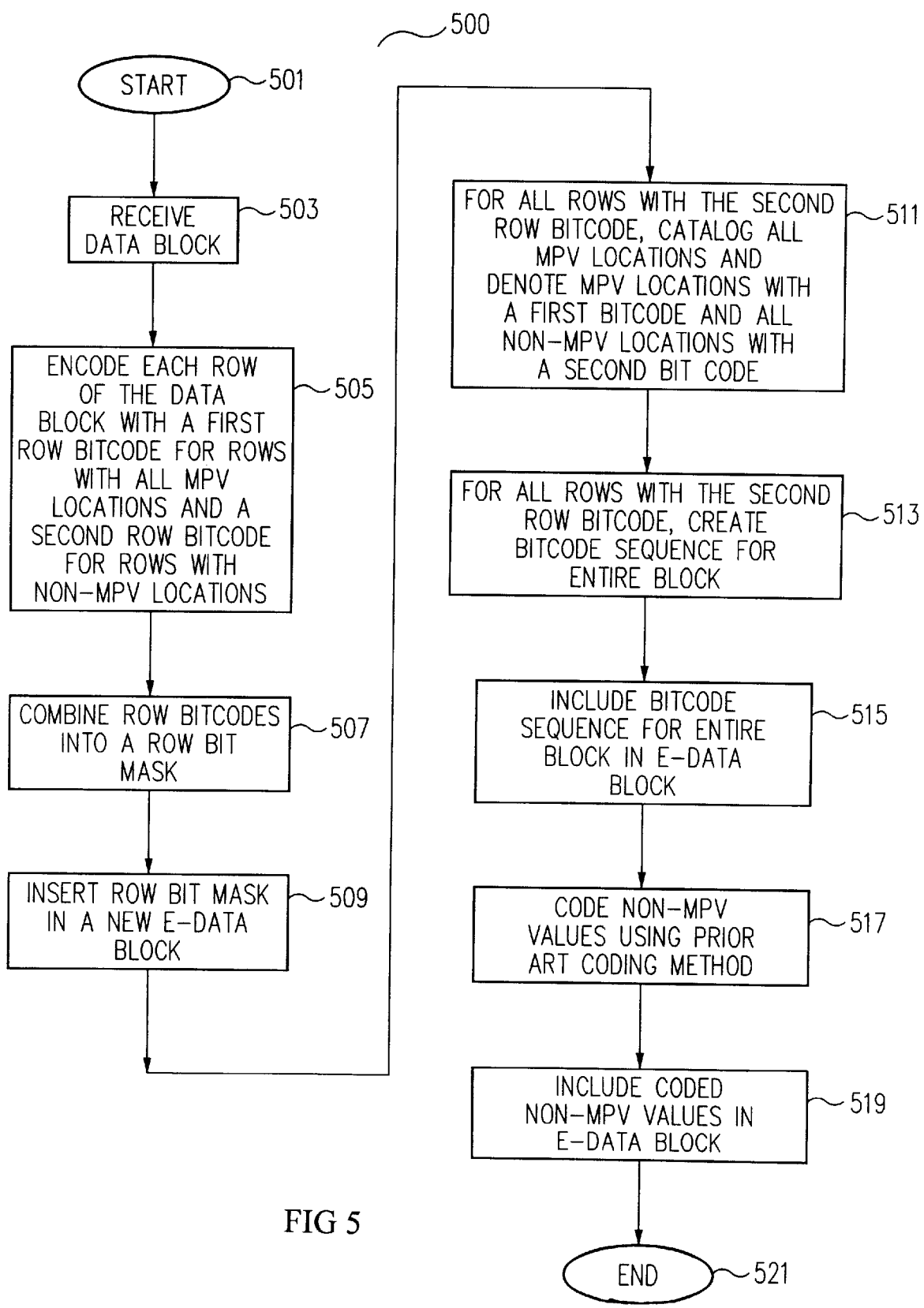
FIG. 5 is a flowchart depicting a sequence of events for creating a row bit mask and including the row bit mask in the method of the invention in accordance with the principles of one embodiment of the invention.

FIG. 5 is a flowchart graphically illustrating one process 500 according to the principles of the present invention. Process 500 starts at 501.

At 503, the raw data block is received for encoding. As discussed above, in one embodiment of the invention, the raw data is video data and is packaged in 8×8 matrices, such as data matrix 200 in FIG. 4 for transfer or storage.

At 505 in FIG. 5, each row of the data block is assigned a value for a row bitcode. A first row bitcode value, such as a "1", is assigned to each row that has the MPV in every location and a second row bitcode value, such as "0", is assigned to each row that includes non-MPV locations.

At 507 in FIG. 5, the row bitcodes for each row are combined into a row bit mask.

At 509 in FIG. 5, the row bit mask for the data block is included in an E-data block created according to the invention.

At 511 in FIG. 5, for all rows with the second row bitcode value, the locations of the MPVs are cataloged and denoted with a first bitcode value, such as single bit equal to a "1", and all non-MPVs locations are denoted with a second bitcode value, such as a single bit equal to a "0" in the manner discussed above.

At 513 in FIG. 5, a bitcode sequence for all rows having the second row bitcode value assigned, in one embodiment all rows with row bitcode values of "0", is created which represents the MPV and non-MPV locations in the data block.

At 515 in FIG. 5, the bitcode sequence for all rows with the second row bitcode value is sent to the E-data block created in accordance with the method of the invention.

At 517 in FIG. 5, the non-MPV values in the non-MPV locations for all rows with the second row bitcode value in the data block are coded using any one of numerous coding schemes to create encoded non-MPVs.

At 519 in FIG. 5, the encoded non-MPVs for all rows with the second row bitcode values in the data block are sent to the E-data block; the encoding process ends at 521.

According to this embodiment of the invention, as with the embodiment discussed above with respect to FIGS. 2A, 2B and 3, the decoding process is, for the most part, simply the reverse of the coding process. When decoding, the row bit mask is used to identify those rows that have the MPV in every location and the MPV is inserted in these locations, without involving the prior art decoding routines for these rows. Then, in one embodiment of the invention, the matrix bitcode sequence is used to determine the sequence of MPV locations, such as exemplary MPV location 299 (FIG. 4), for all rows that include non-MPV locations and the MPV is inserted at MPV locations, without invoking any of the decoding routines of the prior art coding schemes. Then, according to one embodiment of the invention, the prior art coding scheme is used to decode the encoded non-MPV values for all rows that include non-MPV locations and these decoded non-MPV values are inserted in the non-MPV locations, such as exemplary non-MPV location 297. Consequently, according to the invention, the cumbersome prior art decoding processes and routines are only used on the non-MPVs and only on rows that contain non-MPV locations.

As was discussed above, when, as in one embodiment of the invention, the process of FIG. 5 is used with variable length coding, the variable length codes for the non-MPV values are shorter than codes created using prior art methods that required the MPV be included as a valid code word. In addition, the cumbersome variable length decoding process is not invoked for the most frequently occurring values. Therefore, this variable length decoding process is frequently avoided and the processing of the data is significantly sped up and simplified. In addition, using this embodiment of the invention, entire rows of data can be handled with minimal processing and can be virtually taken out of the prior art coding scheme routines.

As also discussed above, in one embodiment of the invention, the row bit masks are sent, and the rows with all MPV locations are specified, before the row bitcode sequences are sent, and the MPV locations are specified. This is done, in one embodiment of the invention, to maximize decoding efficiency.

As mentioned above, when video data for an image is broken down into E-blocks of 64 values in an 8×8 matrix (See FIGS. 2A, 2B and 4). In the one embodiment of the invention discussed above with respect to FIGS. 4 and 5, if N rows are not made up entirely of MPV locations, then the E block consists of 8 bits of row-coding bit mask, 8N bits of row bitcode sequence, and then the encoded non-MPV values. In one embodiment of the invention, the E block is coded differently: 8 bits of row-coding bit mask and then, for each non-MPV row: a) 8 bits of row bitcode sequence and b) the encoded non-MPV values. This is because, in some embodiments of the invention, it can be more convenient for the decoder if the bitcode sequences are interleaved with the non-MPV values. This way the decoder only has to remember the bitcode sequence for the row it is currently decoding.

In the one embodiment of the invention discussed above with respect to FIGS. 4 and 5, the method of the invention was described as being applied on a row by row basis and the bit masks and the bitcode sequences created were row bit masks and row bitcode sequences. However, those of skill in the art will readily recognize that the method of the invention can also be applied on a column basis and column bit masks and column bitcode sequences could be created for columns 221, 223, 225, 227, 229, 231, 233 and 235. In this embodiment of the invention, the inventive process described above would be essentially the same and would be equally effective. Consequently, the one embodiment of the invention described above with respect to FIGS. 4 and 5 was chosen for illustrative purposes only and is not intended to limit the invention to the one embodiment discussed.

In addition, in the example of one embodiment of the invention discussed above with respect to FIGS. 4 and 5, it was generally assumed that the value in MPV locations was the MPV. However, those of skill in the art will recognize that the value in the shaded MPV locations could also be any frequently occurring value and need not be limited to the MPV. In addition, in other embodiments of the invention, the inventive method can be applied multiple times to the same data with different values (for example the first and second most frequently occurring values), in different locations, being cataloged and denoted and then exempted from the prior art coding schemes. Consequently, the values chosen to be cataloged and denoted, and the number of times the method of the invention is applied to the same data, will vary from application to application, according to the needs of the system and the designer. Therefore, the present invention is not intended to be limited to the particular embodiments of the invention discussed herein and numerous variations of the invention will be readily apparent to those skilled in the art in light of this disclosure.

In addition, in the example of one embodiment of the invention discussed above with respect to FIGS. 4 and 5, a row bitcode sequence was used to identify and denote the MPV locations in the rows. However, those of skill will readily recognize that other methods of identifying and denoting the MPV locations can be utilized with the invention including, but not limited to, run-length encoding or various other encoding methods known in the art. Consequently, the one embodiment of the invention described above with respect to FIGS. 2A, 2B and 3 was chosen for illustrative purposes only and is not intended to limit the invention to the one embodiment discussed.

Those of skill in the art will recognize that, in one embodiment of the invention, in order to use the bitcode sequence, the decoder (not shown) must know both the value of the MPV and the length of the row bitcode sequence (or equivalently the total number of numeric values being sent). In one embodiment of the invention, the value of the MPV can be fixed based on the nature of the source data (e.g. it is zero for video data), or it can be included as a separate datum (not shown) in the compressed data stream.

In one embodiment of the invention, the length of the row bitcode sequence can be fixed at an agreed-upon value or included as a separate datum (not shown) in the compressed data stream.

In one embodiment of the invention, agreed-upon values can result from a natural division of the data (e.g. the division of video data into rows of 8 bits each) or from an artificial division chosen for convenience. For example, it is easy to read 32 bits as a single 32-bit integer.

As discussed above, the present invention provides a method for significantly decreasing the number of times prior art coding schemes, such as variable length coding, are implemented in the course of encoding/decoding a given data block. As also discussed above, prior art coding schemes, such as variable length coding, are cumbersome and time consuming processes and that the problems associated with prior art coding schemes, such as variable length coding, were particularly pronounced because, using prior art methods, each and every value was typically subjected to the coding and decoding process.

In contrast, using the method of the invention, the MPV, or any designated frequently occurring value, is left out of the prior art coding process. Consequently, according to the invention, fewer values need to be encoded and decoded using prior art coding schemes and therefore these cumbersome processes and routines are used less frequently. In addition, since according to one embodiment of the invention, it is the MPV, or a designated frequently occurring value, that is left out of the prior art coding schemes, by definition, the prior art coding schemes are used as little as possible.

Consequently, when, as in one embodiment of the invention, variable length coding is the coding scheme used, the variable length codes for the non-MPV values are shorter than codes created using prior art methods that required the MPV be included as a valid code word. In addition, the variable length decoding process including receiving new bits, one at a time, then, with each new bit received, checking the ensemble of received bits with each code entry of the code mapping table until an allowed code is received, is not invoked for the most frequently occurring values. Therefore, this cumbersome variable length decoding process is frequently avoided and the processing of the data is significantly sped up and simplified.

As also discussed above, the present invention can be used in conjunction with existing and readily available prior art coding schemes, including but not limited to: Huffman coding, Golomb coding and variable length coding using adaptive prefix codes. When the present invention is employed with one of these prior art coding schemes, or with any other coding scheme, the present invention provides an encoding and decoding process that is extremely easy to perform and is used efficiently and effectively by any computing system. The present invention is also particularly advantageous when used by a thin client system that does not have high processing power or extensive memory.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention. Consequently, the scope of the invention is defined by the claims and their equivalents.

What is claimed is:

1. A method for coding a designated frequently occurring value in a data block, said method comprising:
   receiving said data block, said data block comprising at least two data locations for holding values;
   determining all of said at least two data locations of said data block that hold said designated frequently occurring value;
   assigning a first bitcode to all of said at least two data locations of said data block that hold said designated frequently occurring value;
   assigning a second bitcode to all of said at least two data locations that hold a value that is not said designated frequently occurring value;
   combining all of said first bitcodes and all of said second bitcodes for said data block into a bitcode sequence for said data block;
   forming an encoded data block to represent said data block; and
   including said bitcode sequence for said data block in said encoded data block.

2. The method of claim 1, wherein;
   said designated frequently occurring value is the most probable value.

3. The method of claim 1, further comprising:
   for each of said data locations assigned said second bitcode, encoding the value in said data location into an encoded value such that all of said data locations that hold a value that is not said designated frequently occurring value have their contents encoded; and
   including said encoded values from each of said data locations assigned said second bitcode in said encoded data block.

4. The method of claim 3, wherein;

said designated frequently occurring value is the most probable value.

5. The method of claim 3, wherein:

for each of said data locations assigned said second bitcode, encoding the value in said data location into an encoded value is done using variable length coding.

6. The method of claim 3, wherein;

said data block is a data matrix and said at least two data locations are arranged in rows and columns.

7. The method of claim 6, further comprising:

determining which rows, of all of said rows in said data matrix, are comprised entirely of data locations that contain said designated frequently occurring value;

assigning a first row bitcode to all of said rows in said data matrix that are comprised entirely of data locations that contain said designated frequently occurring value;

assigning a second row bitcode to all of said rows in said data matrix that comprise at least one data location that contains a value that is not said designated frequently occurring value;

combining all of said first row bitcodes and all of said second row bitcodes for all of said rows in said data matrix into a row bit mask for said data matrix; and including said row bit mask for said data matrix in said encoded data block.

8. The method of claim 7, wherein;

said data matrix is a video data matrix.

9. The method of claim 8, wherein;

said designated frequently occurring value is the most probable value.

10. The method of claim 9, wherein:

for each of said data locations assigned said second bitcode, encoding the value in said data location into an encoded value is done using variable length coding.

11. The method of claim 10, wherein;

said at least two data locations comprises 64 data locations arranged in eight rows and eight columns.

12. The method of claim 6, further comprising:

determining which columns, of all of said columns in said data matrix, are comprised entirely of data locations that contain said designated frequently occurring value;

assigning a first column bitcode to all of said columns in said data matrix that are comprised entirely of data locations that contain said designated frequently occurring value;

assigning a second column bitcode to all of said columns in said data matrix that comprise at least one data location that contains a value that is not said designated frequently occurring value;

combining all of said first column bitcodes and all of said second column bitcodes for all of said columns in said data matrix into a column bit mask for said data matrix; and including said column bit mask for said data matrix in said encoded data block.

13. The method of claim 12, wherein;

said designated frequently occurring value is the most probable value.

14. The method of claim 13, wherein:

for each of said data locations assigned said second bitcode, encoding the value in said data location into an encoded value is done using variable length coding.

15. The method of claim 14, wherein;

said at least two data locations comprises 64 data locations arranged in eight rows and eight columns.

16. A method for coding a most probable value in a data block, said method comprising:

receiving said data block, said data block comprising at least two data locations for holding values;

determining all of said at least two data locations of said data block that hold said most probable value;

assigning a first bitcode to all of said at least two data locations of said data block that hold said most probable value;

assigning a second bitcode to all of said at least two data locations that hold a value that is not said most probable value;

combining all of said first bitcodes and all of said second bitcodes for said data block into a bitcode sequence for said data block;

forming an encoded data block to represent said data block;

including said bitcode sequence for said data block in said encoded data block;

for each of said at least two data locations assigned said second bitcode, encoding the value in said data location into an encoded value such that all of said data locations that hold a value that is not said most probable value have their contents encoded; and including said encoded values from each of said data locations assigned said second bitcode in said encoded data block.

17. The method of claim 16, wherein:

for each of said data locations assigned said second bitcode, encoding the value in said data location into an encoded value is done using variable length coding.

18. The method of claim 17, wherein;

said data matrix is a video data matrix and said at least two data locations comprises 64 data locations arranged in eight rows and eight columns.

19. A method for coding a most probable value in a data matrix, said method comprising:

receiving said data matrix, said data matrix comprising at least two data locations for holding values, said at least two data locations being arranged in rows and columns;

determining which rows, of all of said rows in said data matrix, are comprised entirely of data locations that contain said most probable value;

assigning a first row bitcode to all of said rows that are comprised entirely of data locations that contain said most probable value;

assigning a second row bitcode to all of said rows in said data matrix that comprise at least one data location that contains a value that is not said most probable value;

combining all of said first row bitcodes and all of said second row bitcodes for all of said rows in said data matrix into a row bit mask for said data matrix;

forming an encoded data block to represent said data matrix;

including said row bit mask for said data matrix in said encoded data block;

for all of said rows assigned said second row bitcode, determining all of said data locations that hold said most probable value;

for all of said rows assigned said second row bitcode, assigning a first bitcode to all of said data locations that hold said most probable value;

for all of said rows assigned said second row bitcode, assigning a second bitcode to all of said data locations that hold a value that is not said most probable value;

combining all of said first bitcodes and all of said second bitcodes for all of said rows assigned said second row bitcode, into a one or more bitcode sequences for said data matrix;

including said one or more bitcode sequences for all of said rows assigned said second row bitcode only in said encoded data block;

for each of said data locations assigned said second bitcode only, encoding the value in said data location into an encoded value such that all of said data locations that hold a value that is not said most probable value have their contents encoded; and including said encoded values from each of said data locations assigned said second bitcode in said encoded data block.

20. The method of claim 19, wherein:

for each of said data locations assigned said second bitcode, encoding the value in said data location into an encoded value is done using variable length coding.

21. The method of claim 19, wherein;

said data matrix is a video data matrix and said at least two data locations comprises 64 data locations arranged in eight rows and eight columns.

22. A method for coding a most probable value in a data matrix, said method comprising:

receiving a data matrix, said data matrix comprising at least two data locations for holding values, said at least two data locations being arranged in rows and columns;

determining which columns, of all of said columns in said data matrix, are comprised entirely of data locations that contain said most probable value;

assigning a first column bitcode to all of said columns in said data matrix that are comprised entirely of data locations that contain said most probable value;

assigning a second column bitcode to all of said columns in said data matrix that comprise at least one data location that contains a value that is not said most probable value;

combining all of said first column bitcodes and all of said second column bitcodes for all of said columns in said data matrix into a column bit mask for said data matrix;

forming an encoded data block to represent said data matrix;

including said column bit mask for said data matrix in said encoded data block;

for all of said columns assigned said second column bitcode, determining all of said data locations that hold said most probable value;

for all of said columns assigned said second column bitcode, assigning a first bitcode to all of said data locations that hold said most probable value;

for all of said columns assigned said second column bitcode, assigning a second bitcode to all of said data locations that hold a value that is not said most probable value;

combining all of said first bitcodes and all of said second bitcodes for all of said columns assigned said second column bitcode, into one or more bitcode sequences for said data matrix;

including said one or more bitcode sequences for all of said columns assigned said second column bitcode only in said encoded data block;

for each of said at least two data locations assigned said second bitcode, encoding the value in said data location into an encoded value such that all of said data locations that hold a value that is not said most probable value have their contents encoded; and including said encoded values from each of said data locations assigned said second bitcode in said encoded data block.

23. The method of claim 22, wherein:

for each of said data locations assigned said second bitcode, encoding the value in said data location into an encoded value is done using variable length coding.

24. The method of claim 23, wherein;

said data matrix is a video data matrix and said at least two data locations comprises 64 data locations arranged in eight rows and eight columns.

25. A method for coding one or more designated frequently occurring values in a data block, said method comprising:

receiving said data block, said data block comprising at least two data locations for holding values;

determining all of said at least two data locations of said data block that hold a first designated frequently occurring value;

assigning a first designated frequently occurring value bitcode to all of said at least two data locations of said data block that hold said first designated frequently occurring value;

assigning a non-designated frequently occurring value bitcode to all of said at least two data locations that hold a value that is not said one or more designated frequently occurring values;

combining all of said first designated frequently occurring value bitcodes and all of said non-designated frequently occurring value bitcodes for said data block into a bitcode sequence for said data block;

forming an encoded data block to represent said data block; and including said bitcode sequence for said data block in said encoded data block.

26. The method of claim 25 further comprising:

determining all of said at least two data locations of said data block that hold a second designated frequently occurring value;

assigning a second designated frequently occurring value bitcode to all of said at least two data locations of said data block that hold said second designated frequently occurring value; and including all of said second designated frequently occurring value bitcodes for said data block into said bitcode sequence for said data block.

27. The method of claim 26 further comprising:

determining all of said at least two data locations of said data block that hold a third through Nth designated frequently occurring value;

assigning a third through Nth designated frequently occurring value bitcode to all of said at least two data locations of said data block that hold said third through Nth designated frequently occurring value, respectively; and including all of said third through Nth designated frequently occurring value bitcodes for said data block into said bitcode sequence for said data block.

* * * * *